(12) United States Patent
Wu

(10) Patent No.: US 8,547,772 B2
(45) Date of Patent: Oct. 1, 2013

(54) MEMORY POWER SUPPLY CIRCUIT

(75) Inventor: Kang Wu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 216 days.

(21) Appl. No.: 13/283,611

(22) Filed: Oct. 28, 2011

(65) Prior Publication Data

US 2012/0307584 A1    Dec. 6, 2012

(30) Foreign Application Priority Data

Jun. 2, 2011 (CN) .......................... 2011 1 0147490

(51) Int. Cl.
*G11C 5/14* (2006.01)
(52) U.S. Cl.
USPC ........... 365/226; 365/244; 365/227; 361/235; 361/785; 361/600; 361/601
(58) Field of Classification Search
USPC ................. 365/226, 244, 227; 361/235, 785, 361/600, 601
See application file for complete search history.

(56) References Cited

U.S. PATENT DOCUMENTS

| 8,250,391 B2 * | 8/2012 | Lee ................................ 713/320 |
| 2010/0027307 A1 * | 2/2010 | Li et al. ........................... 365/51 |
| 2011/0138211 A1 * | 6/2011 | Kim ............................... 713/324 |

* cited by examiner

*Primary Examiner* — Vu Le
*Assistant Examiner* — Han Yang
(74) *Attorney, Agent, or Firm* — Altis & Wispro Law Group, Inc.

(57) ABSTRACT

A memory power supply circuit is used for providing power to a first memory module received in a first memory slot and a second memory module received in a second memory slot, and comprises a logic circuit and a switching power supply. The logic circuit comprises a first input terminal electrically connected to the first memory slot, a second input terminal electrically connected to the second memory slot, and a first signal terminal. The switching power supply comprises a first power terminal, a second power terminal, and a second signal terminal electrically connected to the first signal terminal. When the first memory slot and the second memory slot receive the first memory slot and the second memory module, the switching power supply turns on the first power terminal and the second power terminal; otherwise, the switching power supply turns off the first power terminal or the second power terminal.

9 Claims, 2 Drawing Sheets

MEMORY POWER SUPPLY CIRCUIT

BACKGROUND

1. Technical Field

The present disclosure relates to power supply circuits, and particularly, to a memory power supply circuit.

2. Description of Related Art

A switched power supply has a higher conversion efficiency as the amount of power drawn by a load nears the maximum power output of the switched power supply. Therefore, users usually choose a switched power supply having a maximum output power that is only slightly greater than or equal to the operating power drawn by the load. However, if the switching power supply is used for memory modules of a computer, and if users remove one or more memory modules from the computer, the ratio of the operating power of the installed and working memory to the maximum output power of the switching power supply is reduced, thus the conversion efficiency of the power supply is reduced accordingly.

Therefore, it is desirable to provide a memory power supply circuit that can overcome the above-mentioned limitations.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
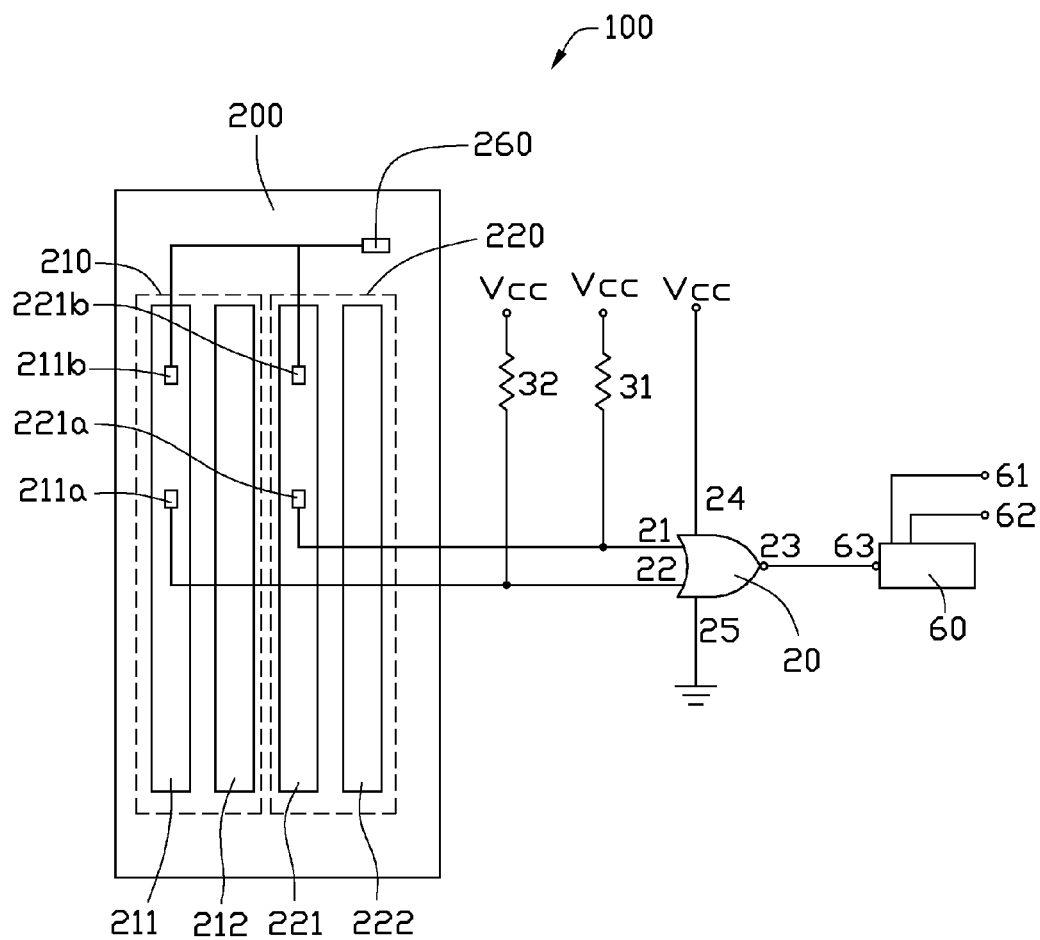
FIG. 1 is a circuit diagram of a memory power supply circuit, according to an exemplary embodiment.
Figure 2:
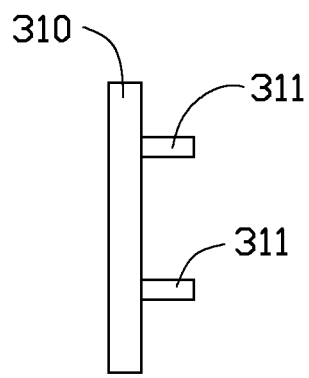
FIG. 2 is a schematic view of a first memory module, a second memory module, a third memory module, and a fourth memory module powered by the memory power supply circuit of FIG. 1 in an exemplary embodiment.
Figure 2:
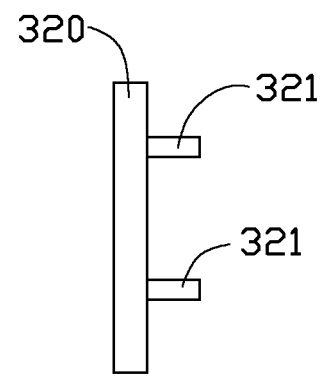
Figure 2:
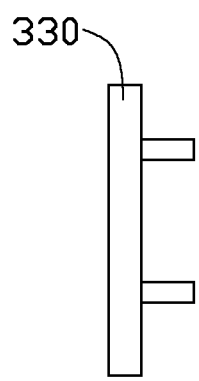
Figure 2:
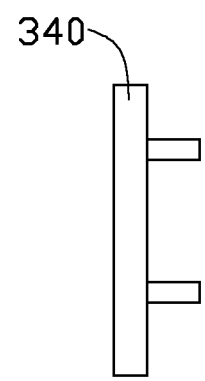

Referring to FIG. 1 and FIG. 2, a memory power supply circuit 100, according to an exemplary embodiment, is used for supplying a proper level of power according to characteristics of memory module(s) received in memory channels of a motherboard 200. The motherboard 200 comprises a first memory channel 210, a second memory channel 220, and a grounding point 260. The first memory channel 210 comprises a first memory slot 211 and a third memory slot 212. The second memory channel 220 comprises a second memory slot 221 and a fourth memory slot 222. The first memory slot 211 may receive or not receive a first memory module 310. The second memory slot 212 may receive or not receive a second memory module 320. The third memory slot 221 may receive a third memory module 330. The fourth memory slot 222 may receive a fourth memory module 340. The first memory module 310, the second memory module 320, the third memory module 330, and the fourth memory module 340 are same type of memory modules.

The first memory slot 211 has a first grounding hole 211a and a second grounding hole 211b. The second memory slot 221 has a third grounding hole 221a and a fourth grounding hole 221b. The first grounding hole 211a and the third grounding hole 221a are insulated from the grounding point 260. The second grounding hole 211b and the fourth grounding hole 221b are electrically connected to the grounding point 260. The first memory module 310 comprises two first grounding pins 311 electrically connected to each other. When the first memory module 310 is inserted into the first memory slot 211, the two first grounding pins 311 are respectively inserted into the first grounding hole 211a and the second grounding hole 211b, and thus the first grounding hole 211a is electrically connected to the grounding point 260.

The second memory module 320 comprises two second grounding pins 321 electrically connected to each other. When the second memory module 320 is inserted into the second memory slot 221, the two second grounding pins 321 are respectively inserted in the third grounding hole 221a and the fourth grounding hole 221b, and thus the third grounding hole 221a is electrically connected to the grounding point 260.

The memory power supply circuit 100 comprises a logic circuit 20, a first pull-up resistor 31, a second pull-up resistor 32, and a switching power supply 60.

The logic circuit 20 comprises a first input terminal 21, a second input terminal 22, and a first signal terminal 23. The first input terminal 21 is electrically connected to the first grounding hole 211a. The second input terminal 22 is electrically connected to the third grounding hole 221a. The first input terminal 21 is further electrically connected to a direct current (DC) power source Vcc through the first pull-up resistors 31. The second input terminal 22 is electrically connected to the DC power source Vcc through the second pull-up resistors 32. The first signal terminal 23 is electrically connected to the switching power supply 60. In one embodiment, the logic circuit 20 is a NOR gate chip.

The switching power supply 60 comprises a first power terminal 61, a second power terminal 62, and a second signal terminal 63. Both of the first power terminal 61 and the second power terminal 62 are electrically connected to the first memory slot 211, the second memory slot 221, the third memory slot 212, and the fourth memory slot 222. A maximum power output of the first power terminal 61 is P1, a maximum power output of the second power terminal 62 is P2, power consumption of the first memory module 310 is P0, the first memory slot 211 is N1, the second memory slot 221 is N2, the third memory slot 212 is N3, the fourth memory slot 222 is N4, wherein $P1=P2=(N1+N2+N3+N4-1)\times P0$. The third memory slot 212 and the fourth memory slot 222 are not limited to this embodiment (such as, two, three).

The second signal terminal 63 is electrically connected to the first signal terminal 23, and thus the switching power supply 30 can output a proper level of power according to the input signal of the first signal terminal 23. In particular, when the first signal terminal 23 outputs a low-level "0" to the second signal terminal 63, the switching power supply 60 turns on the first power terminal 61, and turns off the second power terminal 62, and thus only the first power terminal 61 outputs power. When the first signal terminal 23 outputs a high-level "1", the switching power supply 60 turns on both the first power terminal 61 and the second power terminal 62, and thus the first power terminal 61 and the second power terminal 62 output power.

In use, there exist the following four possible situations:

(1) when the first memory slot 211 receives the first memory module 310, the second memory slot 221 receives the second memory module 320, the first grounding hole 211a and the third grounding hole 221a are electrically connected to the grounding point 260, each of the first input terminal 21 and the second terminal 22 obtains a low-level "0", and thus the first signal terminal 23 outputs a high-level "1" to the second signal terminal 63, causing the switching power supply 60 to turn on both the first power terminal 61 and the second power terminal 62 to output power.

(2) When the first memory slot 211 doesn't receive the first memory module 310, the second memory slot 212 doesn't receive the second memory module 320, the first grounding hole 211a and the third grounding hole 221a are not electrically connected to the grounding point 260, the first pull-up resistor 31 pulls the input signal of the first input terminal 21 to a high level "1", the second pull-up resistor 32 pulls the input signal of the second input terminal 22 to a high level "1", and thus the first signal terminal 23 outputs a low level "0" to the second signal terminal 63, the switching power supply 60 turns on the first power terminal 61, and turns off the second power terminal 62, that is, only the first power terminal 61 can output power.

(3) When the first memory slot 211 receives the first memory module 310, the second memory slot 221 doesn't receive the second memory module 320, the first input terminal 21 is grounded, but the second input terminal 22 is not grounded. The first input terminal 21 outputs a low level "0", the second input terminal 22 outputs a high level "1", and thus the first signal terminal 23 outputs a low level "0" to the second signal terminal 63, the switching power supply 60 turns on the first power terminal 61, and turns off the second power terminal 62, that is, only the first power terminal 61 outputs power.

(4) when the first memory slot 211 doesn't receive the first memory module 310, the second memory slot 221 receives the second memory module 320, the working process is similar to situation (3), so only the first power terminal 61 outputs power.

The memory power supply circuit 100 can supply a proper level of power according to the total memory modules (i.e. the first memory module 310, the second memory module 320, the third memory module 330, and the fourth memory module 340) received in the motherboard 200, and thus the ratio of the sum of the power consumptions of the memory modules to the maximum power outputs of the switching power supply 60 becomes closer to one to one, and the conversion efficiency of the switching power supply 60 increases.

In other embodiments, when in the situations (2)-(4), the switching power supply 60 may turn on the second power terminal 62, and turn off the first power terminal 61.

In other embodiments, the logic circuit 20 can be other logic chips (such as an OR gate), and thus the control method of the switching power supply 60 needs to be adjusted accordingly, that is, when the switching power supply 60 receives a high level "1", the first power terminal 61 is turned on, and the second power terminal 62 is turned off; when the switching power supply 60 receives a low level "0", both the first power terminal 61 and the second power terminal 62 are turned on.

It will be understood that the above particular embodiments and methods are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A memory power supply circuit for a motherboard comprising a first memory slot and a second memory slot, the first memory slot is capable of receiving a first memory module, the second memory slot is capable of receiving a second memory module, the memory power supply circuit comprising:

a logic circuit comprising:

a first input terminal electrically connected to the first memory slot;

a second input terminal electrically connected to the second memory slot; and a first signal terminal; and a switching power supply comprising:

a second signal terminal electrically connected to the first signal terminal; and a first power terminal and a second power terminal configured for providing power to the first memory module and the second memory module, wherein a maximum power output of the first power terminal is equal to that of the second power terminal;

wherein in response to the first memory slot receiving the first memory module and the second memory slot receiving the second memory module, the switching power supply turns on the first power terminal and the second power terminal; and wherein in response to at least one of the first memory slot or the second memory slot not receiving the first memory module or the second memory module, the switching power supply turns off one of the first power terminal or the second power terminal corresponding to the at least one of the first memory slot or the second memory slot not receiving the first memory module or the second memory module;

wherein in response to the first memory slot not receiving the first memory module and the second memory slot not receiving the second memory module, the switching power supply turns off one of the first power terminal or the second power terminal, and turns on the other one of the first power terminal or the second power terminal.

2. The memory power supply circuit of claim 1, wherein a maximum power output of the first power terminal is equal to power consumption of the first memory module, the first memory module and the second memory module are same type of memory modules.

3. The memory power supply circuit of claim 1, wherein the motherboard comprises a grounding point, the first memory slot has a first grounding hole and a second grounding hole, the second memory slot has a third grounding hole and a fourth grounding hole, the first grounding hole and the third grounding hole are insulated from the grounding point, the second grounding hole and the fourth grounding hole are electrically connected to the grounding point, when the first memory slot receives the first memory module, the first grounding hole is electrically connected to the grounding point, when the second memory slot receives the second memory module, the third grounding hole is electrically connected to the grounding point.

4. The memory power supply circuit of claim 3, wherein the first memory module comprises two first grounding pins electrically connected to each other, the second memory module comprises two second grounding pins electrically connected to each other, when the first memory module is inserted into the first memory slot, the two first grounding pins of the first memory module are inserted into the first grounding hole and the second grounding hole respectively, when the second memory module is received in the second memory slot, the two second grounding pins of the second memory module are inserted into the third grounding hole and the fourth grounding hole respectively.

5. The memory power supply circuit of claim 4, wherein the memory power supply circuit further comprises a first pull-up resistor and a second pull-up resistor, the first pull-up resistor is electrically connected between the first input terminal and a direct current power source, the second pull-up resistor is electrically connected between the second input terminal and the direct current power source.

6. The memory power supply circuit of claim 5, wherein the logic circuit is a NOR gate, when the second signal terminal receives a low-level "0", the switching power supply turns on one of the first power terminal or the second power terminal, and turns off the other one of the first power terminal or the second power terminal; when the second signal terminal receives a high-level "1", the switching power supply turns on the first power terminal and the second power terminal.

7. The memory power supply circuit of claim 1, wherein the motherboard further comprises at least one third memory slot and at least one fourth memory slot which are electrically connected to the first power terminal and the second power terminal, the at least one third memory slot is capable of receiving at least one third memory module, the at least one fourth memory slot is capable of receiving at least one fourth memory module, the first power terminal and the second power terminal are further configured for providing power to the at least one third memory module and the at least one fourth memory module.

8. The memory power supply circuit of claim 7, wherein the first memory module, the second memory module, the at least one third memory module, and the at least one fourth memory module are same type of memory modules.

9. The memory power supply circuit of claim 8, wherein a maximum power output of the first power terminal is P1, a maximum power output of the second power terminal is P2, power consumption of the first memory module is P0, the first memory slot is N1, the second memory slot is N2, the third memory slot is N3, the fourth memory slot is N4, P1=P2= (N1+N2+N3+N4−1)×P0.

* * * * *